United States Patent
Wu

[19]

[11] Patent Number: 5,989,950
[45] Date of Patent: Nov. 23, 1999

[54] REDUCED MASK CMOS SALICIDED PROCESS

[75] Inventor: Shye-Lin Wu, Hsinchu, Taiwan

[73] Assignee: Texas Instruments - Acer Incorporated, Hsinchu, Taiwan

[21] Appl. No.: 09/013,676

[22] Filed: Jan. 26, 1998

[51] Int. Cl.[6] .............................................. H01L 21/8238
[52] U.S. Cl. ........................... 438/228; 438/231; 438/592
[58] Field of Search ................... 438/228, 229, 438/230, 231, 232, 530, 592, 636

[56] References Cited

U.S. PATENT DOCUMENTS

| | | | |
|---|---|---|---|
| 5,650,341 | 7/1997 | Yang et al. | 438/228 |
| 5,668,024 | 9/1997 | Tsai et al. | 438/231 |
| 5,670,397 | 9/1997 | Chang et al. | 438/232 |
| 5,854,101 | 12/1998 | Wu | 438/231 |

*Primary Examiner*—Chandra Chaudhari
*Attorney, Agent, or Firm*—Harness, Dickey & Pierce, P.L.C.

[57] ABSTRACT

The present invention includes forming an oxide layer, nitride on a substrate. An ion implantation is performed. A LPD-oxide is formed on P well. Subsequently, an ion implantation to dope phosphorus into the substrate to form N well. Then, the LPD-oxide is removed. The oxide layer and the silicon nitride layer are respectively removed. Subsequently, a thin gate oxide is regrown on the surface of the substrate. A polysilicon layers, a second nitride are deposited on the oxide layer. Polysilicon gates are patterned. An ion implantation is carried out to implant arsenic into the P well. A thin LPD-oxide is forged along the surface of the gate, the substrate on the P well. A thermal anneal process is used to condense the LPD-oxide. Simultaneously, an ultra thin silicon oxynitride layer is formed on the surface of N well. Next, BSG side wall spacers are formed on the side walls of the gates. The silicon nitride layer is removed. Self-align silicide (SALICIDE), polycide are respectively formed on the exposed substrate, gates. Then, an ion implantation is performed. Then, another ion implantation is next used. Finally, ultra shallow junction source and drain are formed adjacent to the gates by using a rapid thermal process (RTP).

27 Claims, 7 Drawing Sheets

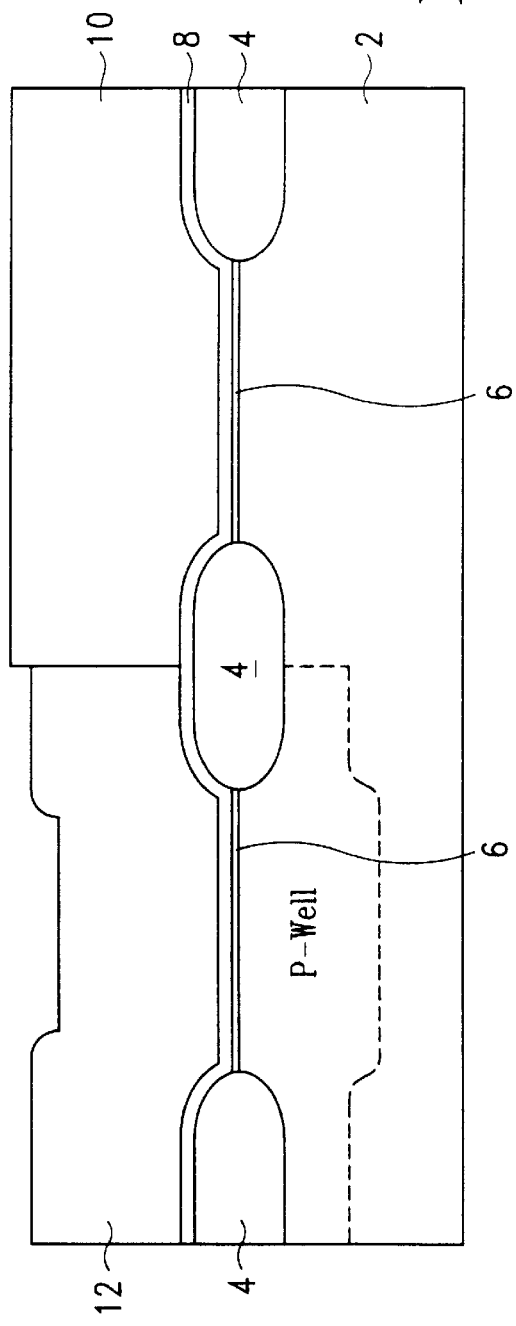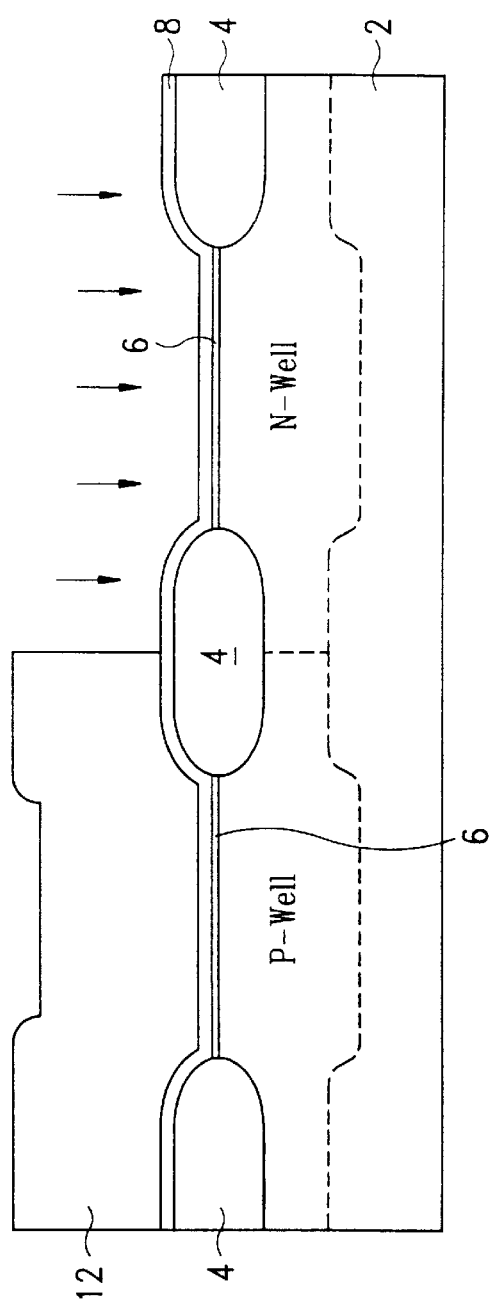

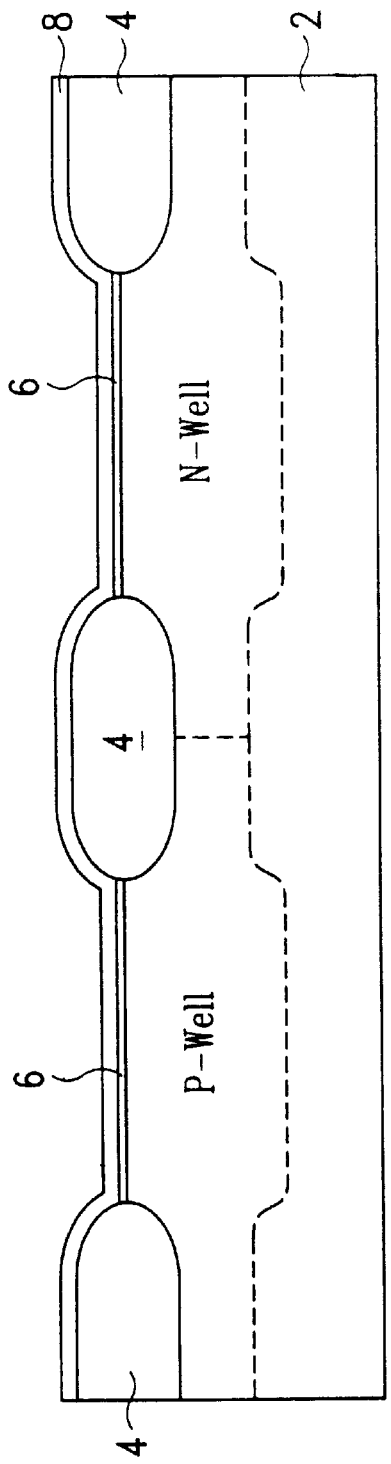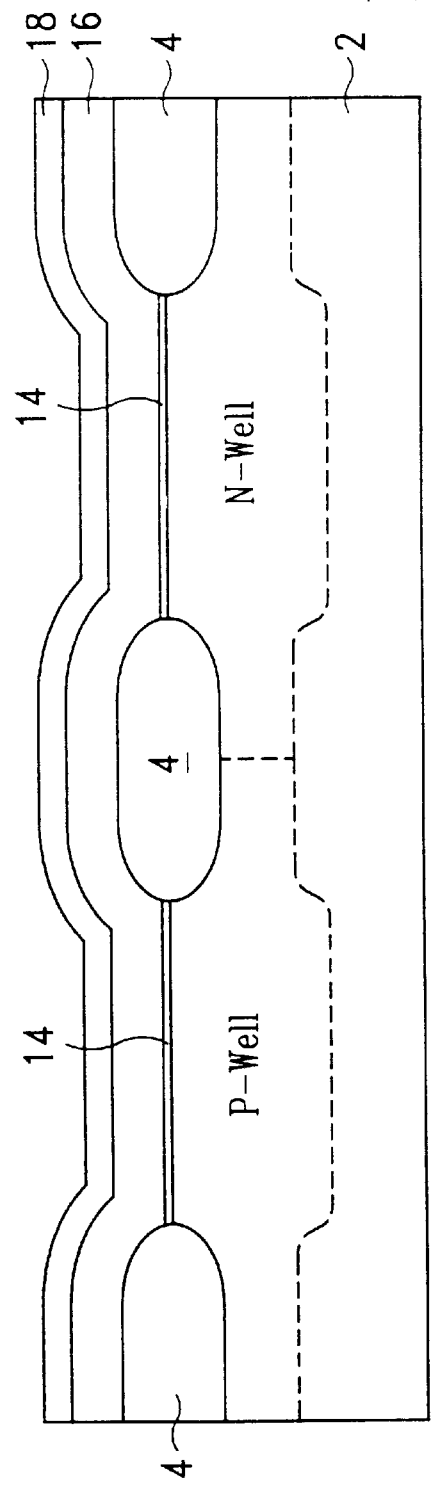

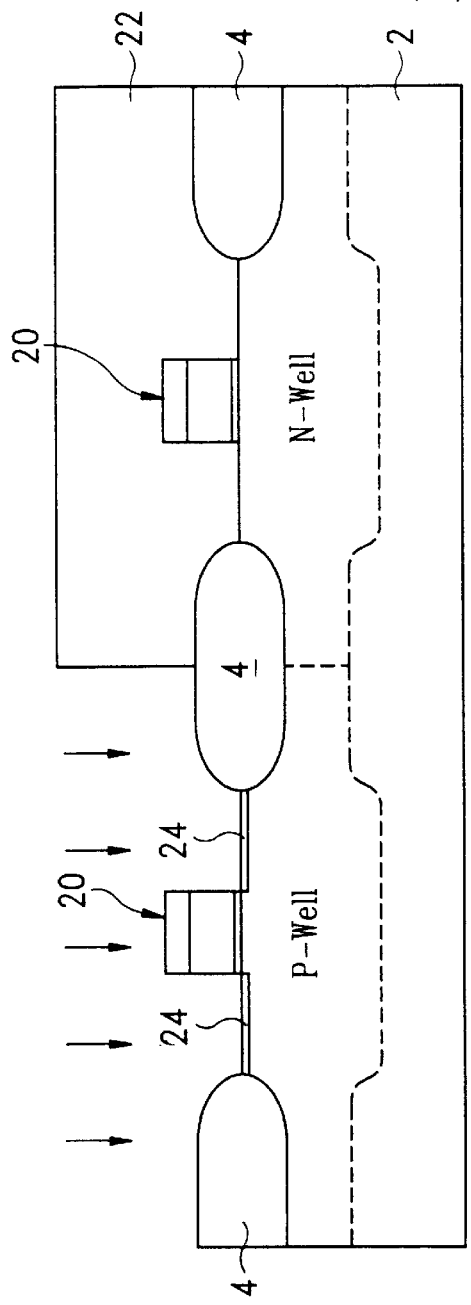
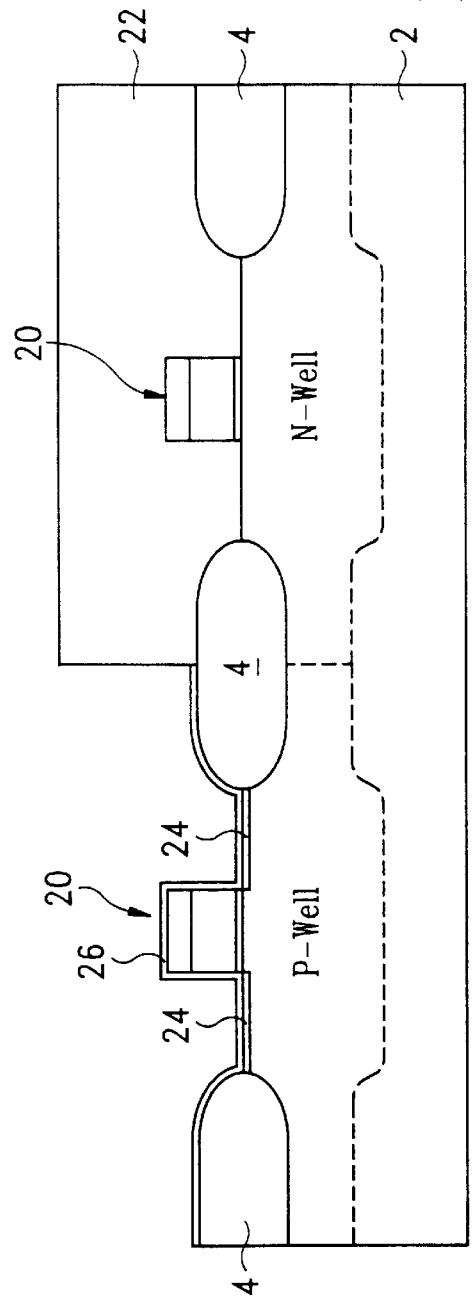

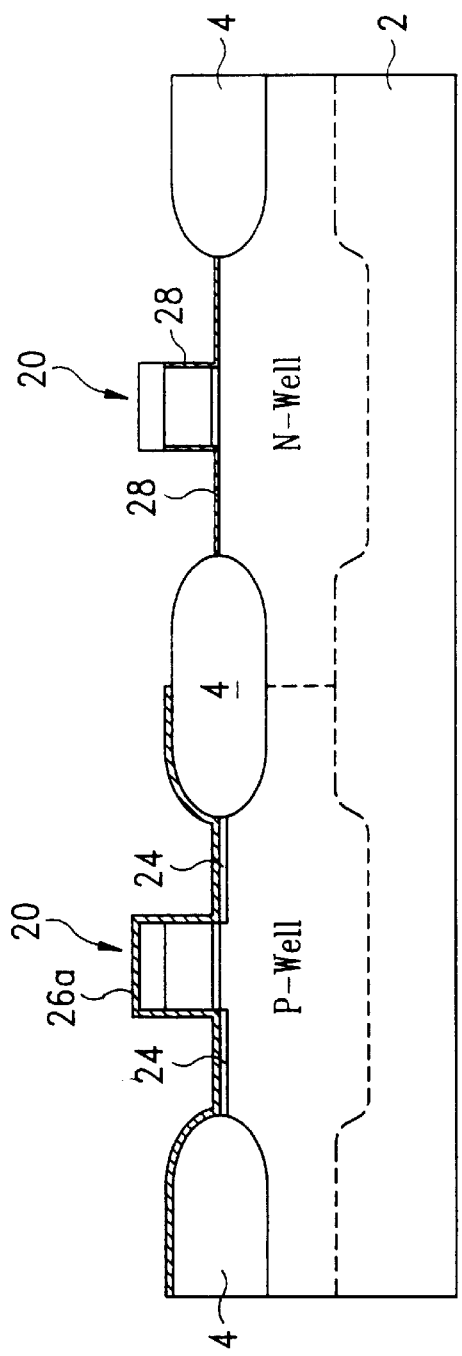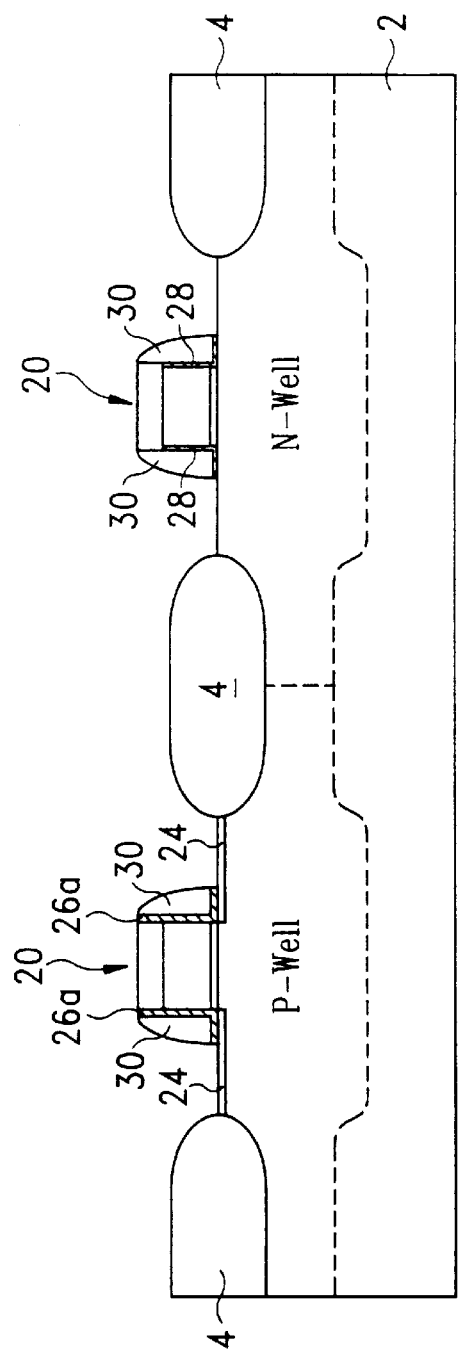

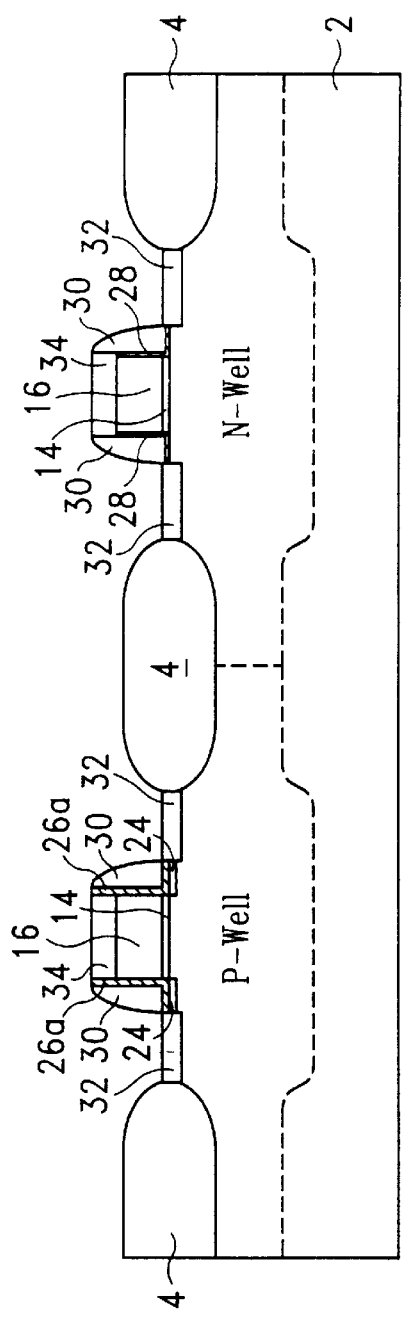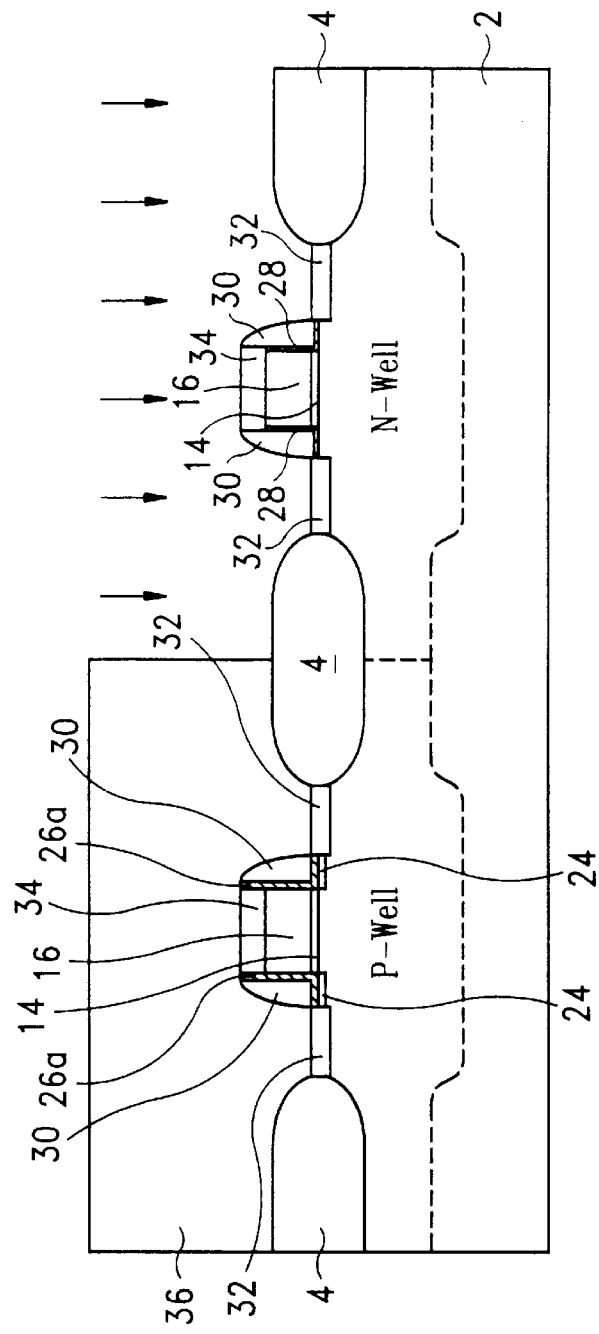

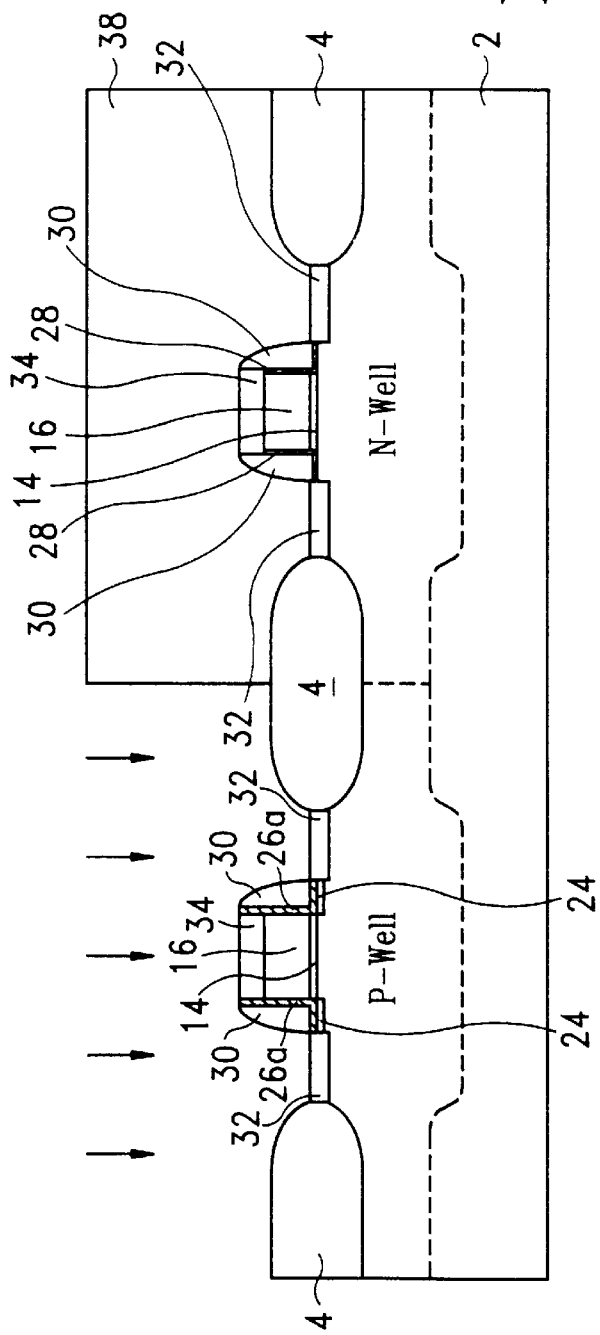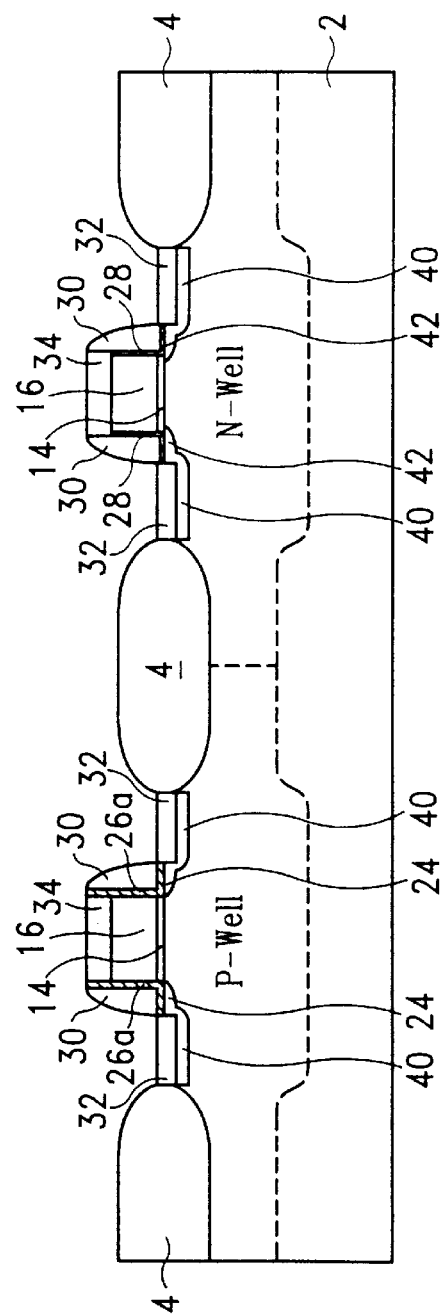

REDUCED MASK CMOS SALICIDED PROCESS

FIELD OF THE INVENTION

The present invention relates to semiconductor devices, and more specifically, to complementary metal-oxide-semiconductor (CMOS) devices.

BACKGROUND

High performance CMOS technology has been developed for years. In order to achieve high packing density wafer for ultra large scale integrated (ULSI) circuits, the dimensions of devices are scaled down to sub-micron range. The pay for the scaled devices is, for example, the parasitic effect which will degrade the RC delay and source and drain series resistance. Prior art discloses the degradation factor of propagation delay (Tpd) on gate electrode sheet resistance (Rgsh) as function of channel width. Please refer to the article "A Novel 0.15 $\mu$m CMOS Technology using W/WN$_x$/ Polysilicon Gate Electrode and Ti Silicided Source/Drain Diffusions, M. T. Takagi et al., 1996, IEDM 96-455". The author suggests that the use of lower Rgsh enlarges the degree of freedom in LSI design. Self-aligned metal silicided process is one of the way to reduce the resistance of the gate, the source and drain. In addition, the self-aligned metal silicided process can increase the operation speed, which is a requirement for ultra-short channel MOSFET. CMOS technology integrating W/WN$_x$/Polysilicon gate electrode and Ti silicided source and drain has been proposed by Takagi.

For ULSI circuits, the gate oxide is also shrink to a very thin dimension. Therefore, the reliability of the ultra thin oxide is a serious problem to the scaled devices. Typically, the reliability of the gate oxide is influenced by many factors, such as the hot carriers and the radiation hardness. In order to provide MOSFETs with reliable gate oxide, many structure of the gate oxide have been proposed. For example, the oxide containing nitrogen atoms is used to take place of the thermal oxide. Another method is the use of fluorinated gate oxides that are formed by immersing silicon in HF solution or by ion implantation of F atoms into silicon gate. One prior art to approach the purpose is by forming a liquid phase deposition (LPD) oxide followed by a high temperature rapid thermal oxidation in oxygen or N$_2$O ambient. The F atoms will be incorporated into the oxides by LPD technique. Please see "Reliable Fluorinated Thin Gate Oxides Prepared by Liquid Phase Deposition Following Rapid Thermal Process, Wei-Shin Lu, 1996, IEEE". In the method, the F and N atoms can be simultaneously incorporated into the oxide.

An article relating to the LPD is the literature "The Physicochemical Properties and Growth Mechanism of Oxide (SiO$_{2-x}$F$_x$) by Liquid Phase Deposition with H$_2$O Addition Only, Ching-Fa Yeh, J. Electrochem. Soc., Vol. 141, No. 11, 1994". The oxide can be formed at room temperature by using liquid phase deposition technology, which is referred to the LPD-oxide. The LPD-oxide can be formed by adding H$_3$BO$_3$ or Al to hydrofluosilicic acid (H$_2$SiF$_6$) solution. Equations 1 and 2 below describe the reactions.

$$H_2SiF_6 + 2H_2O \leftarrow\rightarrow 6HF + SiO_2 \quad (1)$$

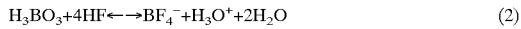

$$H_3BO_3 + 4HF \leftarrow\rightarrow BF_4^- + H_3O^+ + 2H_2O \quad (2)$$

To precisely control the impurity distribution is another issue of the scaled devices. Shallow and high concentration p source and drain is a requirement for ULSI PMOS. It is very hard to obtain the aforementioned condition by using ion implantation. A solid phase diffusion (SPD) has been proposed to overcome the issue. More detail, the shallow source and drain of the PMOS are formed by SPD from boron-silicate glass, without affecting the NMOS (See "High Performance Sub-Tenth Micron CMOS Using Advanced Boron Doping and Wsi$_2$ Dual Gate Process, Takeuchi, 1995 Symposium on VLSI Technology Digest of Technique Papers").

However, the conventional method to form CMOS devices needs a lot of mask. Thus, the present invention provides a method for forming CMOS devices with reducing the number of mask.

SUMMARY

In accordance with the present invention, a sub-micron CMOS device with extended shallow source and drain junction is provided. In one embodiment, a N-well and a P-well are created in a substrate using suitable processes. One important feature of the present invention is that the CMOS can be obtained by using only six masks. The method is disclosed as follows. Thick field oxide (FOX) regions are created on a substrate. Subsequently, an oxide layer is formed on the substrate. Next, a silicon nitride layer is formed on the silicon oxide layer. After the silicon nitride layer is formed, a photoresist is patterned on the substrate to expose a region for forming P well. Then, an ion implantation is performed to dope dopant into the substrate. A LPD-oxide is formed on the P well by a liquid phase deposition (LPD) process. The photoresist is striped away to expose a region for forming a N well. Subsequently, a high energy ion implantation to dope phosphorus into the substrate by using the LPD-oxide as a mask, thereby forming the N well. Then, the LPD-oxide is removed by using HF solution or BOE (buffer oxide etching) solution.

The oxide layer and the silicon nitride layer are respectively removed. Subsequently, a thin gate oxide is regrown on the surface of the substrate. An undoped polysilicon layers is deposited on the gate oxide layer. Next, a silicon nitride layer is successively formed on the polysilicon layer to act as an anti-reflective coating (ARC). Ultra short channel polysilicon gates are patterned by using a third photoresist as an etching mask. Then, the third photoresist is removed. Next, a photoresist is coated on the substrate to cover the N well. A low energy and low dosage ion implantation is carried out to implant arsenic into the P well using the forth photoresist as a mask, thus generating n doped ion regions adjacent to the surface of the P well. A thin LPD-oxide is formed along the surface of the gate, the substrate on the P well. A low temperature anneal process in N$_2$O or NO ambient is used to condense the LPD-oxide. Simultaneously, an ultra thin silicon oxynitride layer is formed on the surface of N well.

Next, BSG (boron-silicate glass) side wall spacers are formed on the side walls of the gates. The silicon nitride layer is removed. Self-align silicide (SALICIDE) and polycide are respectively formed on the exposed substrate and gate region.

A photoresist is patterned on the N well. An ion implantation is performed by using the photoresist as a mask to dope high dosage p conductive type ions into the substrate and the gate on the N well. Then, the photoresist is removed. Another photoresist is subsequently patterned on the substrate to expose the P well. Similarly, n conductive type dopant is doped into the substrate and gate on the N well. Then, the photoresist is also stripped.

Finally, ultra shallow junction source and drain are formed adjacent to the gates by using a high temperature rapid thermal process (RTP). Extended p+ source and drain are simultaneously formed in the N well under the side wall spacers by diffusing the dopant in the spacers.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 3 is a cross sectional view of a semiconductor wafer illustrating the step of forming a first liquid phase deposition oxide on the semiconductor substrate;

FIG. 4 is a cross sectional view of a semiconductor wafer illustrating the step of performing a second ion implantation to form a N well in the semiconductor substrate;

FIG. 5 is a cross sectional view of a semiconductor wafer illustrating the step of removing the first liquid phase deposition oxide;

FIG. 6 is a cross sectional view of a semiconductor wafer illustrating the steps of removing first oxide, nitride layers and forming a second oxide layer, polysilicon layer, second silicon nitride layer on the semiconductor substrate;

FIG. 7 is a cross sectional view of a semiconductor wafer illustrating the step of performing a third ion implantation;

FIG. 8 is a cross sectional view of a semiconductor wafer illustrating the step of forming a second LPD oxide on the semiconductor substrate;

FIG. 9 is a cross sectional view of a semiconductor wafer illustrating the step of performing a first thermal anneal process;

FIG. 10 is a cross sectional view of a semiconductor wafer illustrating the step of forming BSG side wall spacers on the side walls of gates;

FIG. 11 is a cross sectional view of a semiconductor wafer illustrating the step of forming silicide, polycide on substrate and gates, respectively;

FIG. 12 is a cross sectional view of a semiconductor wafer illustrating the step of performing a forth ion implantation to dope ions into the N well;

FIG. 13 is a cross sectional view of a semiconductor wafer illustrating the step of performing a fifth ion implantation to dope ions into the P well; and FIG. 14 is a cross sectional view of a semiconductor wafer illustrating the step of performing a second thermal anneal process to form ultra shallow junction.

DETAILED DESCRIPTION

Figure 1:
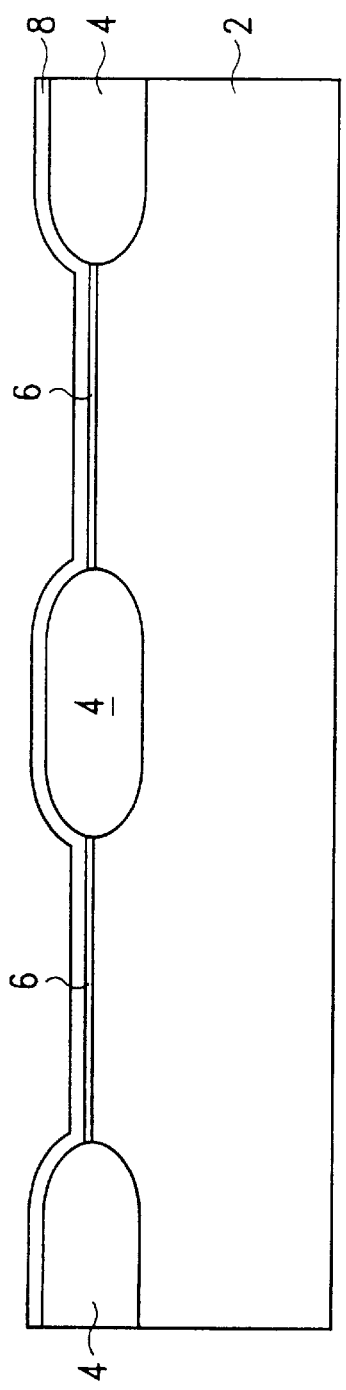
FIG. 1 is a cross sectional view of a semiconductor wafer illustrating the step of forming a first oxide and a first silicon nitride layer on a semiconductor substrate.

Referring to FIG. 1, a single crystal substrate 2 with a <100> crystallographic orientation is used for the preferred embodiment. In this embodiment, Thick field oxide (FOX) regions 4 are created for the purposes of isolation. Typically, the FOX regions 4 are created via a first photoresist and dry etching to etch a silicon nitride-silicon dioxide composite layer. After the photoresist is removed and wet cleaned, thermal oxidation in an oxygen ambient is performed to form the FOX regions 4, to a thickness of about 3000–8000 angstroms. The silicon nitride layer is then typically removed using hot phosphoric acid while the silicon dioxide is removed by using HF.

Subsequently, a thin oxide layer 6 is formed on the substrate 2 to use as a gate oxide. In the preferred embodiment, the gate oxide layer 6 is composed of silicon oxide that is formed by using an oxygen-steam ambient, at a temperature between about 800 to 1100 degrees centigrade. Alternatively, the gate oxide 6 may be formed using other known oxide chemical compositions and procedures. For example, the gate oxide layer 6 can be silicon dioxide formed using a chemical vapor deposition process, with a tetraethylorthosilicate (TEOS) source, at a temperature between about 600 to 800 degrees centigrade and a pressure of about 0.1 to 10 torr. In the preferred embodiment, the thickness of the gate oxide layer 6 is about 15–200 angstroms. Next, a silicon nitride layer 8 is formed on the silicon oxide layer 6.

Figure 2:
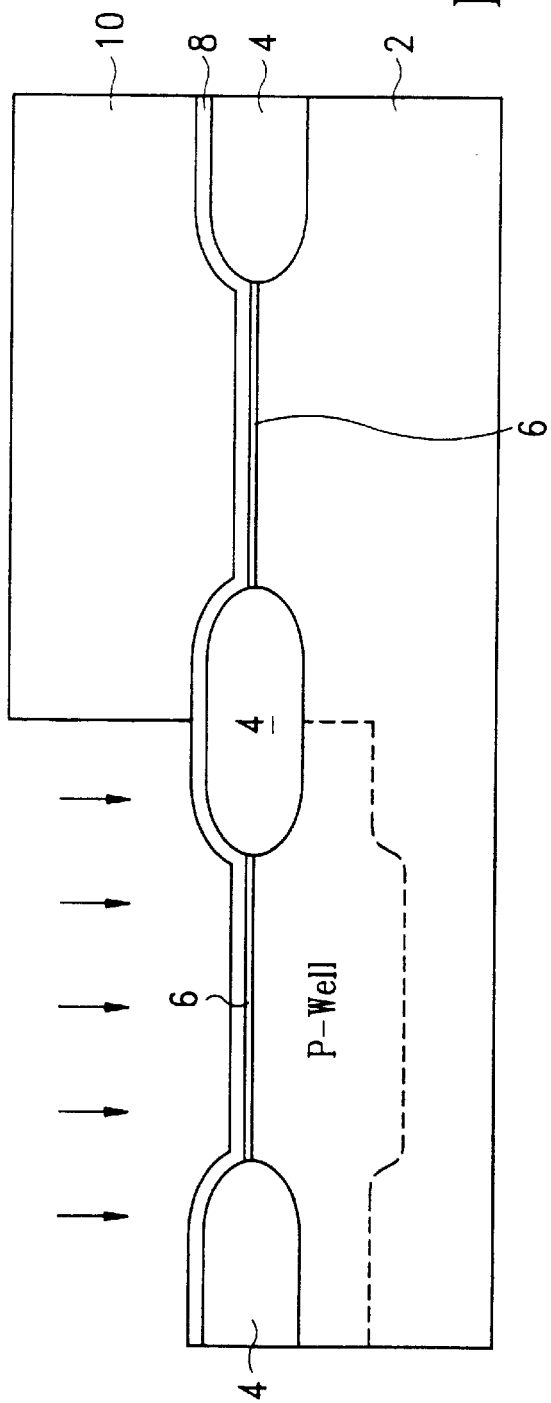
FIG. 2 is a cross sectional view of a semiconductor wafer illustrating the step of performing a first ion implantation to form a P well in the semiconductor substrate.

Referring to FIG. 2, after the silicon nitride layer 8 is formed, a second photoresist 10 is patterned on the substrate 2 to expose a region for forming P well. Then, an ion implantation is performed by using the second photoresist 10 as a mask to dope dopant into the substrate 2. Preferably, the dopant includes boron containing ions. In the step, the ion implantation is high energy ion implantation with an energy about 0.3 to 3 MeV.

Turning to FIG. 3, the region over the P well is then formed with oxide 12 by a liquid phase deposition (LPD) process using the second photoresist 10 as a mask. In this embodiment, the LPD process is performed at room temperature using supersaturated hydrofluosilicic acid ($H_2SiF_6$) aqueous solution as a source liquid to form silicon dioxide and hydrofluoric acid (HF), with boric acid ($H_3BO_3$) to consume the hydrofluoric acid. This low temperature process is used advantageously to keep the second photoresist 10 intact. The thickness of the LPD-oxide 12 is about 5000 to 20000 angstroms.

Now referring to FIG. 4, the second photoresist 10 is striped away to expose a region for forming a N well. Subsequently, a high energy ion implantation to dope, preferably, phosphorus ions into the substrate 2 using the LPD-oxide 12 as a mask, thereby forming the N well. The energy of the ion implantation is about 0.5 to 5 MeV. Then, the LPD-oxide 12 is removed by using HF solution, BOE (buffer oxide etching) solution or the like, as shown in FIG. 5.

Turning to FIG. 6, the gate oxide layer 6 and the silicon nitride layer 8 are respectively removed. Subsequently, a thin gate oxide 14 is regrown on the surface of the substrate 2. An undoped polysilicon layers 16 is deposited by chemical vapor deposition on the gate oxide layer 14. Next, a silicon nitride layer 18 is successively formed on the polysilicon layer 16 to act as an anti-reflective coating (ARC).

Turning next to FIG. 7, the undoped polysilicon layer 16, ARC layer 18, the oxide layer 16 are patterned to form ultra short channel polysilicon gates 20 by using a third photoresist as an etching mask. Then, the third photoresist is removed. Next, a forth photoresist 22 is coated on the substrate 2 to cover the N well. A low energy and low dosage ion implantation is carried out to implant dopant into the P well using the forth photoresist as a mask, thus generating n doped ion regions 24 adjacent to the surface of the P well. The dopant preferably includes arsenic. The energy and dosage of the implantation are respectively about 0.5 to 80 KeV, 5E11 to 5E14 atoms/$cm^2$.

The next step is to form a thin LPD-oxide 26 along the surface of the gate 20, the substrate 2 on the P well and on a portion of the FOX 4 using the forth photoresist as a mask. FIG. 8 depicts the structure after forming the LPD-oxide 26. In the preferred embodiment, the LPD-oxide 26 is formed to have a thickness about 10 to 20 nm.

A thermal anneal process in an ambient containing N atoms will upgrade the performance of an oxide. As shown in FIG. 9, a low temperature anneal process in $N_2O$ or NO ambient is used to condense the LPD-oxide 26a. The temperature for this step can range from 700 to 1050 degrees centigrade. Simultaneously, an ultra thin silicon oxynitride layer 28 is formed on the surface of N well, and on the side walls of the gate that is on the N well. The thickness of the silicon oxynitride layer 28 is about 1–2 nm.

Next, turning to FIG. 10, oxide side wall spacers 30 having boron dopant, such as BSG (boron-silicate glass) side wall spacers, are respectively formed on the side walls of the gates that are on the N well and P well. In order to achieve this, a BSG layer is deposited over the surface of the substrate 2, and on the gates 20. An anisotropical etching process is performed to etch the BSG layer to generate these BSG side wall spacers 30.

The silicon nitride layer 18 is removed by using hot phosphorus acid solution to expose the gates 20. As can be seen in FIG. 11, self-align silicide (SALICIDE) 32 and polycide 34 are respectively formed on the exposed substrate 2 and gate region 20. Typically, this can be achieved by using well known processes. For example, a metal layer, such as Ti, Pt, Co, W, Ni, Pd, Cr etc, is sputtered on the substrate 2 and gate region 20. Then, a rapid thermal anneal (RTA) at 350 to 700 degrees centigrade in $N_2$ ambient is performed to react the refractory metal with the polysilicon gates 20 and the silicon substrate 2, thereby forming silicide on these portions. Then, a strip step is used to remove non-reactive refractory metal on the side wall spacers 30. Therefore, the SALICIDE 32, polycide are self-aligned formed on these regions.

A fifth photoresist 36 is patterned on the N well, as shown in FIG. 12. An ion implantation is performed by using the fifth photoresist 36 as a mask to dope high dosage p conductive type ions into the substrate 2 and the gate 20 on the N well for forming the source and drain. The doped ions can be boron or $BF_2$. The energy and dosage of the implantation are respectively about 0.1 to 100 KeV, 5E14 to 5E16 atoms/cm$^2$. The, the fifth photoresist 36 is removed after the implantation is done. Turning to FIG. 13, a sixth photoresist 38 is subsequently patterned on the substrate to expose the P well. Similarly, n conductive type dopant is doped into the substrate 2 and gate 20 on the N well using the sixth photoresist 38 as a mask for forming the source and drain. This step is preferably achieved by using an ion implantation with high dosage arsenic. The energy of the implantation is about 0.1 to 100 KeV, the dosage of the implantation is about 5E14 to 5E16 atoms/cm$^2$. Then, the sixth photoresist 38 is stripped.

Finally, turning to FIG. 14, ultra shallow junction source and drain 40 are formed adjacent to the gates 20, respectively by using a high temperature rapid thermal process (RTP). The temperature of this step is about 700 to 1150 degrees centigrade. Extended p+ source and drain 42 are simultaneously formed in the N well under the side wall spacers 30 by diffusing the dopant in the spacers 30 to the substrate 2. As aforesaid, shallow and high concentration p source and drain are required for ULSI PMOS. A solid phase diffusion (SPD) is used to replace the ion implantation. Whereas the extended n+ source and drain 24 are formed by ion implantation, which is referred to the n doped ion regions 24 in FIG. 7.

As can be appreciated from the above disclosure, the present invention provides the following advantages: (1) low mask count (only six masks) CMOS salicided transistors can be achieved for high speed devices. (2) extended ultra-shallow junction structures can be obtained using BSG side wall spacers as a diffusion source to improve the short channel effect.

As is understood by a person skilled in the art, the foregoing embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure. Accordingly, while the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method for manufacturing a CMOS device on a semiconductor substrate, the method comprising:

forming a plurality of field oxide regions on said semiconductor substrate;

forming a first oxide layer on said plurality of field oxide regions;

forming a first silicon nitride layer on said first oxide layer;

patterning a first photoresist on said semiconductor substrate to expose a portion of said semiconductor substrate;

forming a first conductivity well in said semiconductor substrate by a first ion implantation using said first photoresist as a mask;

forming a first liquid phase deposition oxide (LPD-oxide) on said semiconductor substrate over said first conductive well;

removing said first photoresist;

forming a second conductivity well in said semiconductor substrate by a second ion implantation using said first LPD-oxide as a mask;

removing said first LPD-oxide;

removing said first silicon nitride layer;

removing said first oxide layer;

forming a second oxide layer on said semiconductor substrate as a gate oxide;

forming an undoped polysilicon layer on said second oxide layer;

forming a second silicon nitride layer on said undoped polysilicon layer to act as an anti-reflective coating (ARC);

patterning said second silicon nitride layer, said polysilicon layer, and said second oxide layer to form gates on said first, second conductive wells, respectively;

patterning a second photoresist on said second conductive well;

performing a third ion implantation using said second photoresist as a mask to dope second conductive type ions into said first conductive well, thereby forming second conductive type doped regions;

forming a second LPD-oxide layer on said first conductive well and along a surface of said gate on said first conductive well;

performing a first thermal anneal to condense said second LPD-oxide layer, a silicon oxynitride layer being simultaneously formed on said second conductive well and along a surface of said gate on said second conductive well;

forming oxide side wall spacers having first conductive type ions on side walls of said gates;

forming a self-aligned silicide (SALICIDE) on said semiconductor substrate and a polycide on said gates;

patterning a third photoresist on said first well;

performing a forth ion implantation using said third photoresist as a mask to dope first conductive type ions into said second conductive well;

removing said third photoresist;

patterning a forth photoresist on said second well;

performing a fifth ion implantation using said forth photoresist as a mask to dope second conductive type ions into said first conductive well;

removing said forth photoresist; and performing a second thermal anneal to form source and drain junction adjacent to said gates, and extended source and drain under said oxide side wall spacers.

2. The method of claim 1, wherein an energy of said first ion implantation is about 0.3 to 3 MeV.

3. The method of claim 1, wherein ions of said first ion implantation comprise boron.

4. The method of claim 3, wherein said first conductive well is P well.

5. The method of claim 1, wherein a thickness of said first LPD-oxide is about 5000 to 20000 angstroms.

6. The method of claim 1, wherein an energy of said second ion implantation is about 0.5 to 5.0 MeV.

7. The method of claim 1, wherein ions of said second ion implantation comprises phosphorus.

8. The method of claim 7, wherein said first conductive well is N well.

9. The method of claim 1, wherein said first LPD-oxide layer is removed by using HF solution.

10. The method of claim 1, wherein said first LPD-oxide layer is removed by using BOE (buffer oxide etching) solution.

11. The method of claim 1, wherein said second conductive type ions of said third ion implantation comprise arsenic.

12. The method of claim 1, wherein an energy of said third ion implantation is about 0.5 to 80 KeV.

13. The method of claim 1, wherein a dosage of said third ion implantation is about 5E11 to 5E14 atoms/cm$^2$.

14. The method of claim 1, wherein a thickness of said second LPD-oxide is about 10 to 20 nm.

15. The method of claim 1, wherein said first thermal anneal is performed at a temperature about 700 to 1050 degrees centigrade.

16. The method of claim 1, wherein said first thermal anneal is performed in $N_2O$ ambient.

17. The method of claim 1, wherein said first thermal anneal is performed in NO ambient.

18. The method of claim 1, wherein a thickness of said second silicon oxynitride layer is about 1 to 2 nm.

19. The method of claim 1, wherein said oxide side wall spacers comprises boron-silicate glass (BSG).

20. The method of claim 1, wherein said first conductive type ions of said forth ion implantation comprise boron.

21. The method of claim 1, wherein said first conductive type ions of said forth ion implantation comprise $BF_2$.

22. The method of claim 1, wherein an energy of said forth ion implantation is about 0.1 to 100 KeV.

23. The method of claim 1, wherein a dosage of said forth ion implantation is about 5E14 to 5E16 atoms/cm$^2$.

24. The method of claim 1, wherein said second conductive type ions of said fifth ion implantation comprise arsenic.

25. The method of claim 1, wherein an energy of said fifth ion implantation is about 0.1 to 100 KeV.

26. The method of claim 1, wherein a dosage of said fifth ion implantation is about 5E14 to 5E16 atoms/cm$^2$.

27. The method of claim 1, wherein said second thermal anneal is performed at a temperature about 700 to 1150 degrees centigrade.

* * * * *